United States Patent [19]

Malhi et al.

[11] Patent Number: 4,797,373

[45] Date of Patent: Jan. 10, 1989

[54] METHOD OF MAKING DRAM CELL WITH TRENCH CAPACITOR

[75] Inventors: Satwinder S. Malhi, Garland; Gordon P. Pollack, Richardson, both of Tex.

[73] Assignee: Texas Instruments Incorporated, Dallas, Tex.

[21] Appl. No.: 122,560

[22] Filed: Nov. 12, 1987

Related U.S. Application Data

[60] Continuation of Ser. No. 873,466, Jun. 6, 1986, abandoned, which is a division of Ser. No. 666,715, Oct. 31, 1984, abandoned.

[51] Int. Cl.$^4$ ................ H01L 27/10; H01L 21/302
[52] U.S. Cl. .............................. 437/60; 437/48; 437/203; 437/162; 437/919
[58] Field of Search ................ 357/23.6, 55; 365/149; 156/643; 437/47, 48, 60, 203, 162, 919

[56] References Cited

U.S. PATENT DOCUMENTS

| | | | |
|---|---|---|---|
| 4,105,475 | 8/1978 | Jenne | 357/23.6 |
| 4,116,720 | 9/1978 | Vinson | 357/50 |
| 4,199,772 | 4/1980 | Natori et al. | 357/23.6 |
| 4,353,086 | 10/1982 | Jaccodine et al. | 357/51 |
| 4,364,074 | 12/1982 | Garnache et al. | 357/23 |
| 4,396,930 | 8/1983 | Mizutani | 357/23 |
| 4,432,006 | 2/1984 | Takei | 357/23 |
| 4,462,040 | 7/1984 | Ho et al. | 357/23.6 |

FOREIGN PATENT DOCUMENTS

| | | |
|---|---|---|
| 0108390 | 5/1984 | European Pat. Off. . |
| 3525418 | 1/1986 | Fed. Rep. of Germany ..... 357/23.6 |
| 0109367 | 7/1982 | Japan . |
| 0213464 | 12/1982 | Japan . |
| 0003269 | 1/1983 | Japan . |
| 0019366 | 1/1984 | Japan . |
| 1084937 | 9/1967 | United Kingdom . |
| 4199772 | 4/1980 | United Kingdom . |

OTHER PUBLICATIONS

An Isolated-Merged Vertical Capacitor Cell for Large Capacity dRAM; Nakajima et al., IEDM, 1984, pp. 240-243.
Lee et al., "Short-Channel Field Effect Transistors in V-Grooves", IBM TDB, vol. 22, No. 8B, Jan. 1980, pp. 3630-3634.
Chang et al., "Fabrication of V-MOS or U-MOS Random Access Memory Cells with a Self Aligned Word Line", IBM TDB, vol. 22, Dec. 1979, pp. 2768-2771.
Barson, "Dynamic DMOS Random-Access Memory Cell Design With Trench", IBM TDB, vol. 21, No. 7, Dec. 1978, pp. 2755-2756.
Kenney, "V-Groove Dynamic Memory Cell", IBM TDB, vol. 23, No. 9, Feb. 1981, pp. 967-969.
Kenney, "Reduced Bit Line Capacitance in VMOS Devices", IBM TDB, vol. 23, No. 9, Feb. 1981, pp. 4052-4053.
Fatula et al, "N Skin Elimination in UMOS Device by Reoxidation", IBM TDB, vol. 22, No. 8A, Jan. 1980 pp. 3204-3205.
Chang, "Vertical FET Random-Access Memories with Deep Trench Isolation", IBM TDB, vol. 22, No. 8B, Jan. 1980, pp. 3683-3687.
"CMOS Dynamic Random-Access Memory Cell", IBM Tech. Disc. Bull., vol. 28-6 Nov. 1985, pp. 2578-2579.

Primary Examiner—Brian E. Hearn
Assistant Examiner—Tom Thomas
Attorney, Agent, or Firm—Douglas A. Sorensen; Melvin Sharp; James T. Comfort

[57] ABSTRACT

A dRAM cell and array of cells, together with a method of fabrication, are disclosed wherein the cell includes one field effect transistor and one storage capacitor with both the transistor and the capacitor formed in a trench in a substrate. The transistor source, channel and drain and one capacitor plate are formed essentially vertically in the bulk substrate sidewalls of the trench, and the gate and other capacitor plate are formed in two regions of material inserted into the trench and isolated from the bulk by an insulating layer. Signal charge is stored on the capacitor material inserted into the trench by an electrical connection of the bulk substrate source to the capacitor material through the insulating layer. In preferred embodiments word lines on the substrate surface connect to the upper of the inserted regions which forms the gate, and bit lines on the substrate surface form the drains. The trenches and cells are formed at the crossings of bit lines and word lines; the bit lines and the word lines form perpendicular sets of parallel lines.

5 Claims, 5 Drawing Sheets

METHOD OF MAKING DRAM CELL WITH TRENCH CAPACITOR

This application is a continuation of application Ser. No. 873,466, filed June 6, 1986, which is a divisional of application Ser. No. 666,715, filed Oct. 31, 1984, both abandoned.

The present invention relates to semiconductor devices, and, more particularly, to dynamic random access memories.

The development of large monolithic dynamic random access memories (dRAMs) has run into many problems, and one of the most important of these problems is that of shrinking the dRAM cell size without increasing the soft-error rate in order to pack more cells on a chip. Large dRAMs are silicon based and each cell typically includes a single MOS field effect transistor with its source connected to a storage capacitor, its drain connected to a bit line, and its gate connected to a word line; the cell operates by storing a charge on the capacitor for a logic 1 and not storing any charge for a logic 0. Traditionally the cell capacitor has been formed by an inversion layer separated from an overlying electrode by a thin oxide layer and from the substrate by a depletion layer. However, to maintain stable circuit operation the capacitance must be large enough to yield a sufficient signal to noise ratio, and this leads to large substrate area devoted to the capacitor. Further, such a MOS capacitor is vulnerable to charges generated in the substrate by alpha particles (a 5 MeV alpha particle can produce more than 200 femtocoulombs of hazardous electrons), noise injected from the substrate, pn junction leakage over the entire area of the capacitor, and subthreshold leakage of the cell transistor. A typical stored charge in a dRAM cell is 250 fC. For a five volt power supply this requires a storage capacitor of 50 fF; and with a storage oxide thickness of 150 Å, a capacitor area of about 20 square microns is needed. This imposes a lower limit on the cell size if conventional two dimensional technology is used.

One approach to solve these problems appears in Jolly et al, A Dynamic RAM Cell in Recrystallized Polysilicon, 4 IEEE Elec. Dev.Lett. 8 (1983) and forms all basic elements of the cell, including both the access transistor and the charge storage capacitor, in a layer of beam recrystallized polysilicon deposited on an oxide layer on a silicon substrate. The bit line is contained in the recrystallized polysilicon layer, and turning on the transistor causes charge to flow into the storage region, which is composed of heavily doped, recrystallized polysilicon surrounded on the top, bottom, and three sides by thermally grown oxide. The storage capability is about twice that of a conventional capacitor of the same storage area since ground electrodes both above and below are separated from the storage region in the recrystallized polysilicon by capacitor insulator oxides. In addition, the lower oxide isolates the storage region from any charge injected into the substrate either from surrounding circuitry or by alpha particles or other radiation generating soft errors. Further, thick oxide under the bit line and complete sidewall oxide isolation reduce the bit-line capacitance. However, even doubling the capacitance over the traditional design fails to sufficiently shrink the area occupied by the cell capacitor. Further, beam recrystallization disturbs underlying structures and is not a simple, established process.

A second approach to shrinking dRAM cell size relies on a capacitor with plates extending into the substrate. This capacitor, called a corrugated capacitor, is described in H. Sunami et al, A Corrugated Capacitor Cell (CCC) for Megabit Dynamic MOS Memories, IEEE IEDM Tech Digest 806 (1982); H. Sunami et al, A Corrugated Capacitor Cell (CCC) for Megabit Dynamic MOS Memories, 4 IEEE Elec.Dev.Lett. 90 (1983); and K. Itoh et al, An Experimental 1Mb DRAM with On-Chip Voltage Limiter, 1984 IEEE ISSCC Digest of Tech Papers 282. The corrugated capacitor extends about 2.5 microns into the silicon substrate. Fabrication proceeds as follows: Trenches are formed by ordinary reactive sputter etching with $CCl_4$ gas using a CVD silicon dioxide film mask; a wet etch cleans up any dry etching damage and contaminations. After trench formation, a triple storage layer of silicon dioxide/silicon nitride/silicon dioxide is formed on the trench walls. Lastly, the trench is filled with LPCVD polysilicon. Use of the corrugated capacitor assertedly yields more than seven times the capacitance of the conventional cell, with a three micron by seven micron cell having a 60 fF storage capacitance.

A third approach to shrink the area occupied by the cell capacitor is similar to the approach described in the preceding paragraph and forms the capacitor in a trench. For example, E. Arai, Submicron MOS VLSI Process Technologies, IEEE IEDM Tech Digest 19 (1983); K. Minegishi et al, A Submicron CMOS Megabit Dynamic RAM Technology Using Doped Face Trench Capacitor Cell, IEEE IEDM Tech Digest 319 (1983); and T. Morie et al, Depletion Trench Capacitor Technology for Megabit Level MOS dRAM, 4 IEEE Elec.Dev.Lett. 411 (1983) all describe a cell with a traditional design except for the capacitor which has been changed from plates parallel to the substrate to plates on the walls of a trench in the substrate. Such a trench capacitor permits large capacitance per unit area of substrate by simply using a deep trench. The capacitors described in these articles were fabricated as follows: Starting with (100) oriented, p-type, 4–5 ohm-cm resistivity silicon substrates, trench patterns with 0.4–1.0 micron width were formed by electron-beam direct writing. Trenches of 1–3 micron depth were then excavated by reactive ion etching with $CBrF_3$ at a pressure of about 14 mTorr; the trench surfaces were cleared of RIE damage by an etch in a mixture of nitric, acetic, and hydrofluoric acids. PSG was then deposited by CVD using a $PH_3/SiH_4/O_2$ gas system, the phosphorous diffused into the trench surface layers, and the PSG etched away by hydofluoric acid. $SiO_2$ of 150–500 Å was grown in dry $O_2$ or CVD $Si_3N_4$ was deposited 500 Å thick on the trench walls. Lastly, the trenches were filled with LPCVD polysilicon. The capacitance per unit area of trench sidewall was comparable to the capacitance per unit area of a traditional capacitor; consequently, deep trench capacitors can shrink cell substrate area by enhancing the storage capacitor area per unit substrate area. However, the cell transistor in these trench capacitor cells is formed in the bulk substrate adjacent to the capacitor and is not isolated as in the first approach.

The use of trenches for isolation is also well known and has been extensively studied; for example, R.Rung et al, Deep Trench Isolated CMOS Devices, IEEE IEDM Tech Digest 237 (1982); K. Cham et al, A Study of the Trench Inversion Problem in the Trench CMOS Technology, 4 IEEE Elec.Dev.Lett. 303 (1983); A.

Hayasaka et al, U-Groove Isolation Technique for High Speed Bipolar VLSI's, IEEE IEDM Tech Digest 62 (1982); H. Goto et al, An Isolation Technology for High Performance Bipolar Memories—IOP-II, IEEE IEDM Tech Digest 58 (1982); T. Yamaguchi et al, High-Speed Latchup-Free 0.5-um-Channel CMOS Using Self-Aligned $TiSi_2$ and Deep-Trench Isolation Technologies, IEEE IEDM Tech Digest 522 (1983); S.Kohyama et al, Directions in CMOS Technology, IEEE IEDM Tech Digest 151 (1983); and K.Cham et al, Characterization and Modeling of the Trench Surface Inversion Problem for the Trench Isolated CMOS Technology, IEEE IEDM Tech Digest 23 (1983). These isolation trenches are formed in a manner similar to that described for the trench and corrugated capacitors; namely, patterning (typically with oxide mask), RIE with $CBrF_3$, $CCl_4$, $Cl_2$-$H_2$, $CCl_4$-$O_2$, etc. excavation, thermal oxidation (plus LPCVD nitride) of the sidewalls, and filling with polysilicon.

However, the beam recrystallized cell occupies too much substrate area and the trench capacitor cells fail to isolate the transistor and capacitor storage plate from the substrate. And all of these cells do not minimize the substrate area occupied.

SUMMARY OF THE INVENTION

The present invention provides a one-transistor/one-capacitor dRAM cell structure and array in which the cell transistor is formed on the sidewalls of a substrate trench containing the cell capacitor; the word and bit lines cross over this trench. This stacking of the transistor on top of the capacitor yields a cell with minimal area on the substrate and solves a problem of dense packing of cells.

In a preferred embodiment, one capacitor plate and the transistor channel and source region are formed in the bulk sidewall of the trench and the transistor gate and the other plate of the capacitor are both formed in polysilicon in the trench but separated from each other by an oxide layer inside the trench. The signal charge is stored on the polysilicon capacitor plate by an electrical connection of the source region with the polysilicon capacitor plate, and this solves the problem of isolation from the bulk. Further, the bit lines are isolated from the bulk by a thick oxide and thereby keeps bit line capacitance to a minimum.

DESCRIPTION OF THE PREFERRED EMBODIMENTS

Figure 1A:
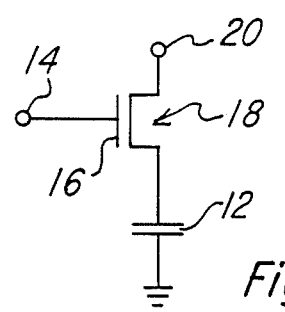
FIGS. 1A–B are the schematic equivalent circuit and local memory array geometry for preferred embodiment dRAM cells.

The preferred embodiment dRAM cells are one transistor/one capacitor cells connected to bit and word lines as shown in schematic FIG. 1A and operate as follows. Capacitor 12 stores charge to represent a bit of information (for example, no stored charge could represent a logic 0 and the stored charge corresponding to a potential of 5 volts across the capacitor plates could represent a logic 1). The bit of information is accessed (to read or to write a new bit) by applying a voltage on word line 14 connected to gate 16 to turn ON transistor 18; a turned ON transistor 18 connects capacitor 12 to bit line 20 for the read or write operation. Leakage currents and other sources of decay of the charge on capacitor 12 necessitate periodic refreshing of the charge, and thus the name dynamic RAM (dRAM).

Figure 1B:
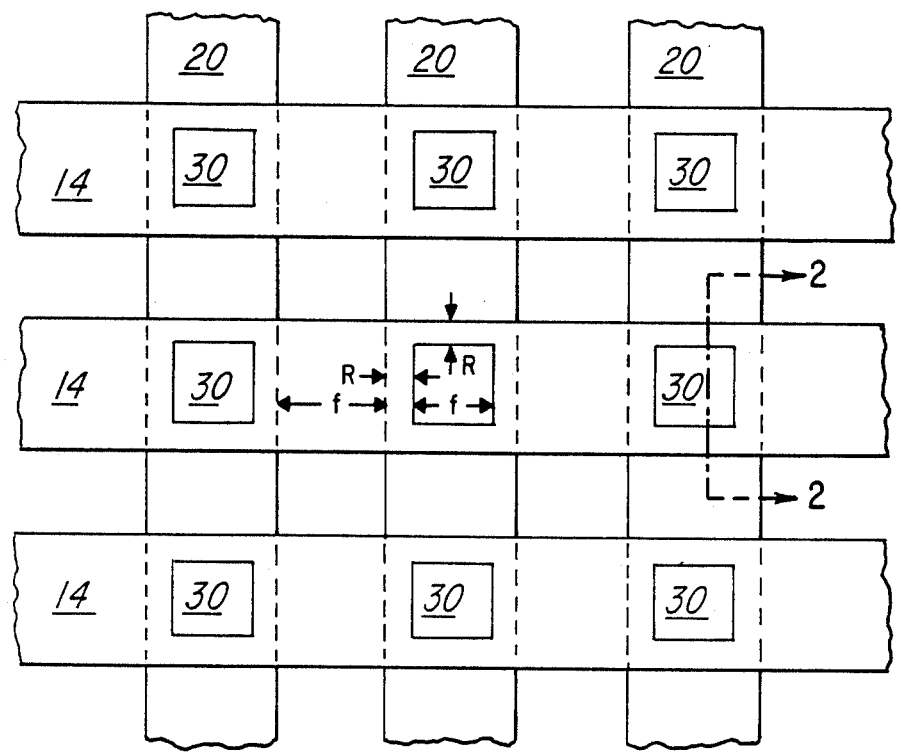

FIG. 1B is a plan view showing a portion of a dRAM array of bit lines 20 and word lines 14 with preferred embodiment cells 30 at the intersections of the lines; note that bit lines 20 pass under word lines 14. The cells extend down into the substrate below the lines and provide a maximal density memory. If the minimum feature size is denoted by f and the minimum registration is denoted by R, then the cell area is $[2(f+R)]^2$. For example, with a minimum feature size of 1.0 micron and a minimum registration tolerance of 0.25 micron, the cell area is about 6.25 square microns.

Figure 2:
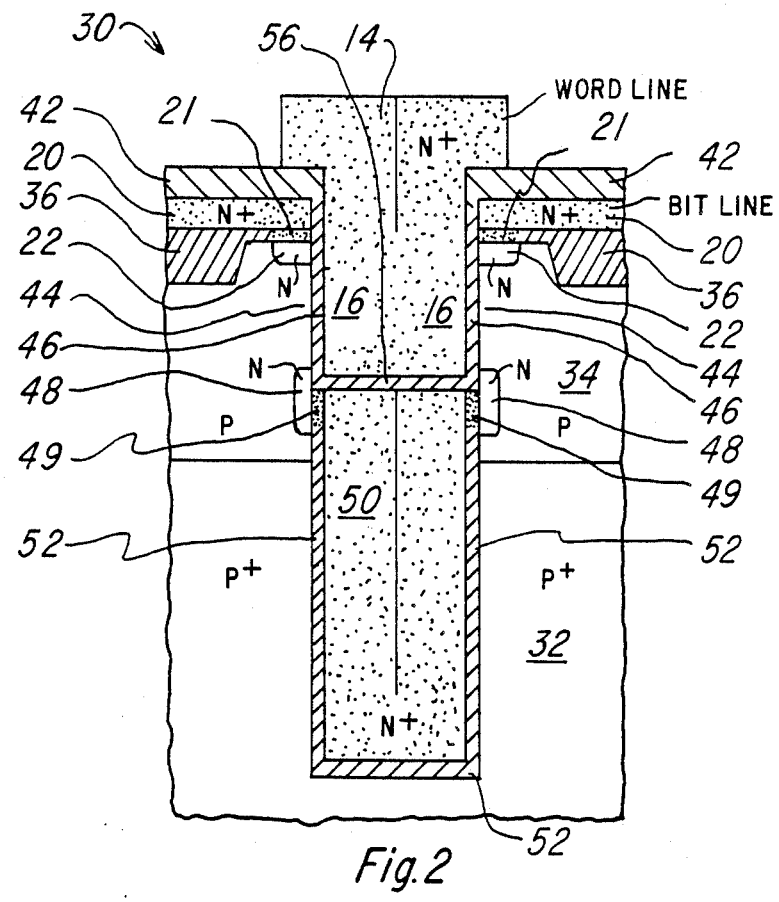
FIG. 2 is a schematic cross sectional elevation of a first preferred embodiment dRAM cell taken along line 2—2 of FIG. 1B.

FIG. 2 is a cross-sectional view of the first preferred embodiment dRAM cell, generally denoted 30. Cell 30 is formed in p+ silicon substrate 32 with p epilayer 34 and includes n+ polysilicon bit line 20, bit line insulating nitride 42, field oxide 36, n+ polysilicon word line 14, transistor 18 channel 44, transistor 18 gate oxide 46, n diffused region 48 which forms the source for transistor 18, n+ polysilicon region 50 which forms one of the plates of capacitor 12 with p+ substrate 32 forming the other and ground plate, oxide 52 which forms the insulator between the plates of capacitor 12, insulating oxide 56 which separates word line 14 from capacitor plate 50, n diffused region 22 which forms the drain of transistor 18, n polysilicon region 21 which connects bit line 20 with drain region 22, and n polysilicon region 49 which connects source 48 with n+ capacitor plate 50. Gate 16 of transistor 18 is simply that portion of word line 14 that is across gate oxide 46 from channel region 44. The view of cell 30 in FIG. 2 corresponds to a section along vertical line 2—2 in FIG. 1B; the square cross section of the trench containing capacitor 12 and transistor 18 is apparent in FIG. 1B.

In cell 30 capacitor 12 is formed with one of its plates being n+ region 50 together with n region 48 and the other plate being substrate 32 together with epilayer 34; however, the doping of epilayer 34 is much lower than that of p+ substrate 32 so the capacitance of the n/p junction of region 48 and epilayer 34 and the capacitance of n+ region 50/oxide 52/p epilayer 34 are both much less than the capacitance of n+ region 50/oxide 52/p+ substrate 32 and may be ignored. Also, as will be detailed below, the plate area of epilayer 34 is small compared to that of substrate 32, and this further makes insignificant the capacitance associated with epilayer 34. Consequently, the bulk of the charge stored by capacitor 12 is isolated from substrate 32 (and epilayer 34) by oxide 52. For a trench with a one micron by one micron cross section and six micron depth, the capacitor 12 plate area would be about 21 square microns if one micron of the depth is epilayer 34 and bit line 20. P+ substrate 32 is the ground common to all cells 30 in an array.

Transistor 18 in cell 30 is entirely in bulk silicon with a polysilicon gate; channel region 44 is part of p epilayer 34, source region 48 (which is also a part of a plate of capacitor 12) and drain region 20 are n diffusions in p epilayer 34, gate oxide 46 is grown on the trench surface of p epilayer 34, and gate 16 is part of polysilicon word line 14. Field oxide 36 is fairly thick and minimizes the capacitance of bit line 20.

The dimensions and materials characteristic of cell 30 are best understood in connection with the following description of a first preferred embodiment method of fabrication; FIGS. 3A–G illustrate the sequence of process steps.

1. (100) oriented p+ silicon substrate 32 of resistivity less than 1E-2 ohm-cm has p epilayer 34 grown with a carrier concentration of 2E16/cm3 and thickness such that after all thermal processing the final p epilayer thickness is two microns. Field oxide 36 (including protective oxide 37) is formed by standard processing. As an example, SWAMI process may be used (grow stress relief oxide, deposit LPCVD nitride, pattern and plasma etch the nitride-oxide-silicon, boron implant for channel stops, grow second stress relief oxide, deposit second nitride, deposit LPCVD oxide, plasma etch LPCVD oxide-nitride, wet etch filaments of LPCVD oxide remaining from previous etch, thermally grow field oxide to yield an approximately planar structure, and strip the nitrides). Regardless of the method used, the final thickness of field oxide 36 is 5000A and protective oxide 37 is about 200A thick. 2000A of polysilicon 20 is deposited by LPCVD, doped to a carrier concentration of 1 E20/cm3, and patterned and etched to form bit lines 20. Next, 10,000A of nitride 42 is deposited by LPCVD; see FIG. 3A.

2. Nitride 42 is patterned to define the one micron square trenches. The patterned nitride 42 is then used as the mask for RIE with HCL excavation of the trenches to a depth of 6 microns. The trench walls are cleaned of RIE damage and contamination with a wet acid etch; see FIG. 3B. Note that nitride 42 is also partially removed by the RIE.

3. Oxide 52 is grown to a thickness of 200A on the trench walls and bottom. The trench is then filled with n+ doped polysilicon as part of a deposition of 7000A of n+ polysilicon by LPCVD; see FIG. 3C.

4. Polysilicon 50 is planarized, such as with spun on photoresist, and plasma etched completely away on the surface and down into the trench to about 3000A above the epilayer 34/substrate 32 interface; see FIG. 3D. As will be seen below, the location of the top of the remaining polysilicon 50 in the trench will approximately determine the bottom of the channel of transistor 18. Note that nitride layer 42 is further eroded by the plasma etch but is still at least 2000A thick.

5. The exposed portion to oxide 52 is etched, and this etching is continued to overetch 1000 to 2000A of oxide. This overetch removes the top portion of oxide 52 between epilayer 34 and polysilicon 50 to a depth of 1000 to 2000A, as indicated by arrows 53 in FIG. 3E; and also removes 1000 to 2000A of protective oxide 37 between epilayer 34 and bit line 20, as indicated by arrows 39 in FIG. 3E. This overetch in effect is forming two small annular crevices, each with a depth of 1000 to 2000A and a width of 200A; one of these small crevices girdles the top portion of polysilicon 50 as indicated by arrows 53, and the other of these small crevices runs horizontally around the boundary of bit line 20 as indicated by arrows 39.

Figure 3A:
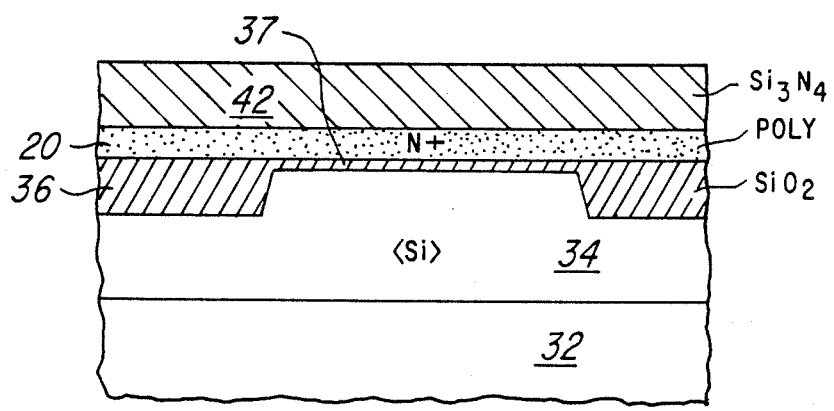
FIGS. 3A–G illustrate a sequence of process steps for fabrication of the first preferred embodiment cell by a first preferred embodiment method.
Figure 3C:
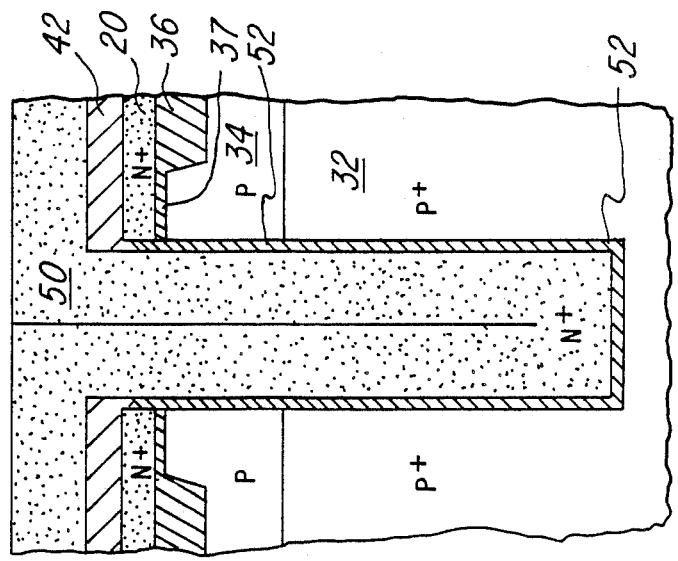
Figure 3B:
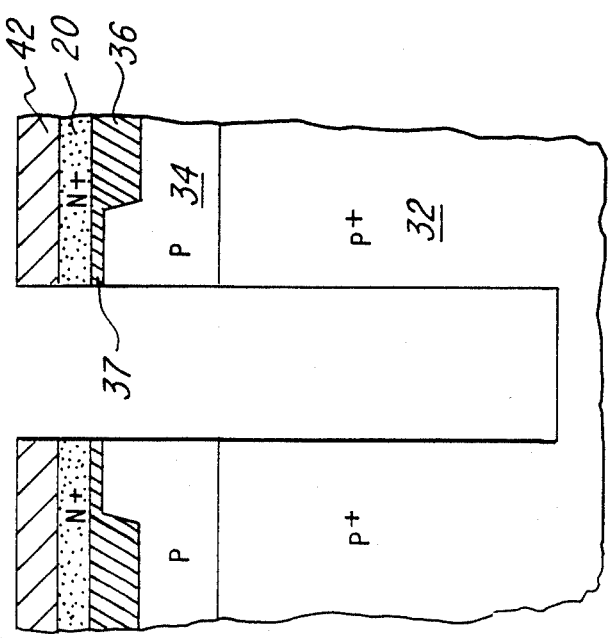
Figure 3E:
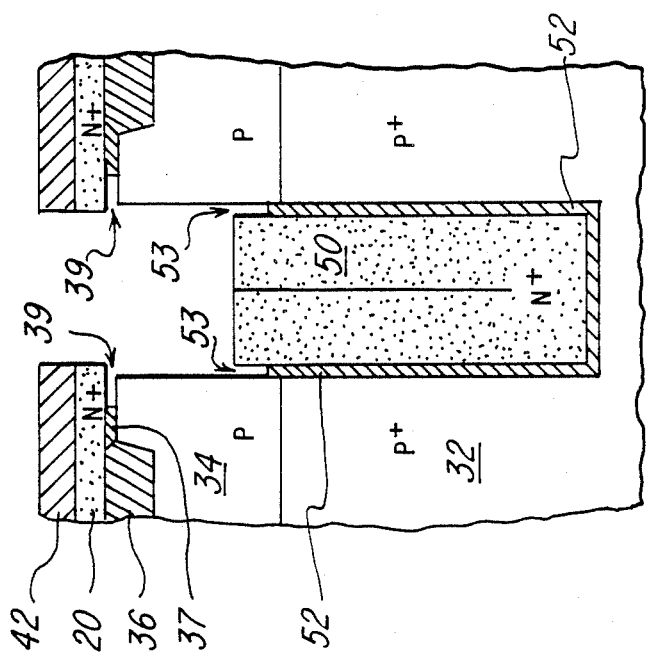
Figure 3D:
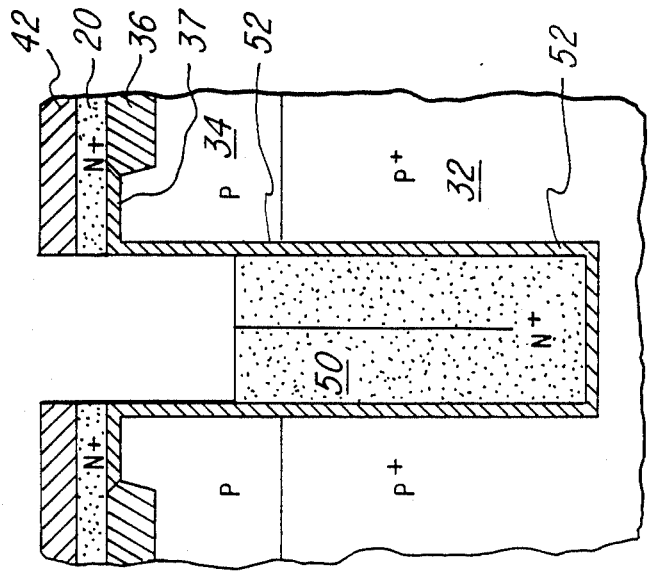
Figure 3G:
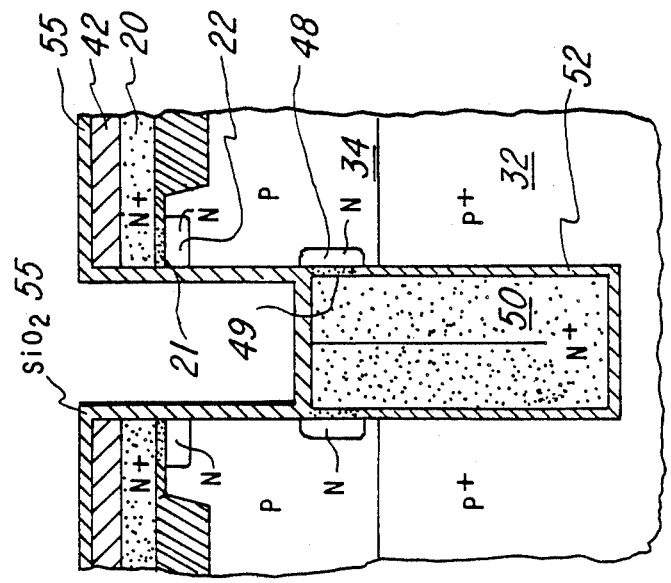
Figure 3F:
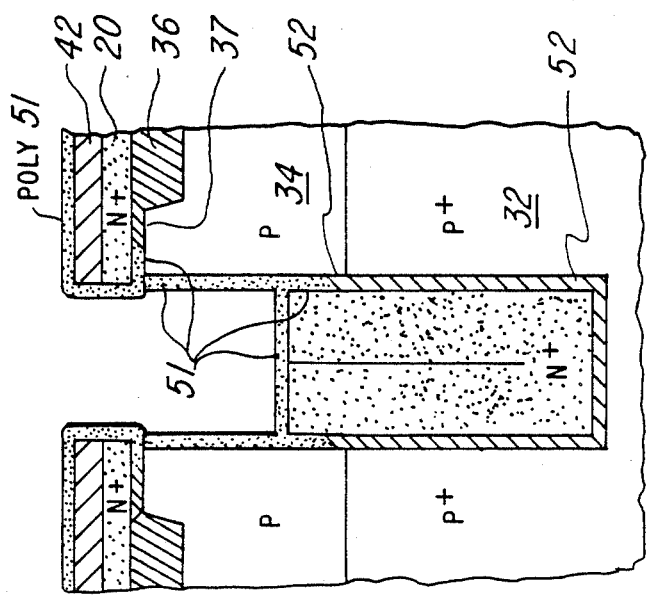

6. 200A of polysilicon 51 is deposited by LPCVD, this is sufficient thickness to insure that the small crevices indicated by arrows 53 and 39 in FIG. 3E are filled; see FIG. 3F.

7. 500A of oxide 55 is thermally grown, this is just enough oxidation to oxidize all of polysilicon 51 except for that portion in the small crevices indicated by arrows 53 and 39 in FIG. 3E, which are too far from the oxidizing interface. This amount of oxidation also consumes very little epilayer 34. The high temperatures of the thermal oxidation of polysilicon 51 causes the dopant in n+ polysilicon 50 to diffuse through the polysilicon 51 in the small crevice indicated by arrows 53 and into p epilayer 34; this diffusion of dopants forms n type polysilicon region 49 and n type region 48 in p epilayer 34; see FIG. 3G. Further, a similar diffusion of dopants from bit line 20 through the polysilicon in the small crevice indicated by arrows 39 and into epilayer 34 forms n polysilicon region 21 and n type region 22 in epilayer 34; see FIG. 3G.

8. Oxide 55 is etched away, and gate oxide 46 plus insulating oxide 56 thermally grown; gate oxide 46 is grown to a thickness of 250A, and oxide 56 is, consequently, somewhat thicker because it is simultaneously grown on n+ doped polysilicon 50. Lastly, 7000A of n+ polysilicon is deposited by LPCVD and patterned and etched to form word lines 14. See FIG. 2 for the completed cell. Note that gate 16 (the portion of word line 14 opposite channel 44) controls all of channel 44 despite the thickness of oxide 56 because n region 48, which forms the source for transistor 18, is formed by a diffusion of dopants from polysilicon 50 through polysilicon region 49 and thus extends into epilayer 34 vertically from region 49 as well as horizontally. This vertical diffusion extends sufficiently so that gate 16 will control all of channel 44.

Many modifications of the preferred embodiments are available which still fall within the scope of the invention in that such modifications, either singly or in combinations, do not disrupt the storage of signal charge by the capacitor nor the on/off function of the transistor. Such modifications include the following:

The trench cross section could be whatever shape is convenient, such as circular, rectangular, arbitrary convex, corrugated, even multiconnected and could even vary along the vertical, continuously or in steps or both. Similarly, the trench sidewalls need not be vertical, rather any geometry that can be processed should work to a greater or lesser extent, such as bulging, tapered, and sloped sidewalls; indeed, any simply connected trench is homeomorphic to the parallelepiped of the preferred embodiment. Lastly, the dimensions of the trench (depth, cross sectional area, diameter, and so forth) may be varied but in practice are a tradeoff of process convenience, capacitance required, substrate area, and so forth. Of course, the capacitance required depends upon the refresh time, transistor leakage current, supply voltage, soft error immunity, capacitor leakage current, et cetera.

The capacitor insulator can be of any convenient material such as oxide, nitride, oxide-nitride, oxide-nitride-oxide, and other stack combinations, and the oxide could be thermally grown, LPCVD, grown dry or in steam, and so forth. The thickness of the insulator is a tradeoff of process convenience, insulator realibility, dielectric constant, breakdown voltage, and so forth and may vary widely. Of course, if the cell and array are fabricated in semiconductor material other than silicon (such as gallium arsenide, aluminum gallium arsenide, mercury cadmium telluride, germanium, indium phosphide, and so forth), the capacitor insulator will be a corresponding material. Also, for the capacitor formed by a reverse biased junction, the doping profiles may be varied, the choice will be a tradeoff of process convenience, cell size, capacitor performance, and so forth. Similarly, amorphous silicon could be used in place of polysilicon, and the etch back to form the crevices may be wet or dry (plasma).

The transistor can be formed to operate with a variety of threshold voltages by adjusting the threshold voltage (such as by a shallow diffusion on the channel just prior to gate oxide growth or deposition). The doping levels and the doping species can be varied so as to vary the transistor characteristics; note that the transistor channel length is determined approximately by trench depth and channel width is roughly equal to the trench perimeter and that n-channel and p-channel devices require oppositely doped regions. The transistor gate may be polysilicon, metal, silicide, and so forth. All of these variations affect performance of the transistor but are acceptable if the transistor adequately performs as a pass transistor for the cell in view of the other characteristics of the cell including required read and write times, the capacitance, the refresh time, and so forth.

We claim:

1. A method for forming a coupled capacitor and transistor comprising the steps of;

forming a trench in the surface of a substrate;
   coating the surfaces of said trench with a first insulating layer;
   forming a first conductive region by filling the lower portion of said trench with a conductive material;
   removing the exposed portion of said insulating layer plus an additional portion of said insulating layer between said conductive material and said substrate;
   filling the crevice formed by said additional portion removal with a conductive material;
   diffusing dopant atoms from said first conductive region, through said filled crevice, into said substrate to form a source region;
   forming a drain region in said substrate adjacent the upper portion of said trench, separated from said source region by a channel region;
   forming a gate insulating layer in the upper portion of said trench; and
   filling the remainder of said trench with a conductive material which serves as a gate.

2. A method according to claim 1 wherein said substrate comprises silicon.

3. A method according to claim 1 wherein said first insulating layer comprises silicon dioxide.

4. A method according to claim 1 wherein said gate insulating layer comprises silicon dioxide.

5. A method according to claim 1 wherein the conductive material used is silicon.

* * * * *